United States Patent [19]
Gabillard et al.

[11] Patent Number: 5,627,963
[45] Date of Patent: May 6, 1997

[54] REDUNDANT READ BUS FOR CORRECTING DEFECTIVE COLUMNS IN A CACHE MEMORY

[75] Inventors: Bertrand Gabillard, Paris; Philippe Girard, Corbeil-Essonnes; Dominique Omet, Evry, all of France

[73] Assignee: International Business Machines Corporation, Armonk, N.Y.

[21] Appl. No.: 466,563

[22] Filed: Jun. 6, 1995

Related U.S. Application Data

[63] Continuation of Ser. No. 46,324, Apr. 15, 1993, abandoned.

[30]  Foreign Application Priority Data

Apr. 30, 1992 [FR] France ............... 92 480062.6

[51] Int. Cl.$^6$ ................................................. G06F 11/00
[52] U.S. Cl. ................... 395/183.18; 395/183.2
[58] Field of Search ................ 395/183.18, 183.16, 395/183.2, 182.01, 182.03, 182.05, 184.01; 365/200, 230.05, 230.06; 371/8.1, 10.2, 10.3

[56] References Cited

U.S. PATENT DOCUMENTS 5,295,114  3/1994  Kobayashi .................. 365/230.06

FOREIGN PATENT DOCUMENTS 0330007  2/1989  European Pat. Off. .......... G06F 12/08
0377249  12/1989  European Pat. Off. .......... G06F 11/20

OTHER PUBLICATIONS

"An Experimental 1-Mbit CMOS SRAM with Configurable Organization and Operation", by Tod Williams, et al., I.E.E.E. Journal of Solid-State Circuits 23 (1988) Oct., No. 5, New York.

Primary Examiner—Hoa T. Nguyen
Attorney, Agent, or Firm—Richard Lau; H. Daniel Schnurmann

[57] ABSTRACT

A cache memory architecture having a separate redundant read bus fully dedicated to redundancy and fed by a single spare sub-array common to all memory sub-arrays of the cache memory. Redundant sense amplifiers are dotted to the redundant read bus, and normal sense amplifiers are connected to a main read bus. Normal and redundant data are valid and available at the same time at the outputs of the normal and redundant sense amplifiers. When the late select address signals become valid, then the correct information can be selected via a multiplexer provided with an INHIBIT input. The multiplexer is normally controlled by decoded signals generated by a decoder, unless redundancy is required. If redundancy is required, the information generated by the bit address comparator forces the multiplexer, via the INHIBIT input, to select the redundant read bus, instead of one read bus of the main read bus, and to output the redundant byte as the selected one.

6 Claims, 6 Drawing Sheets

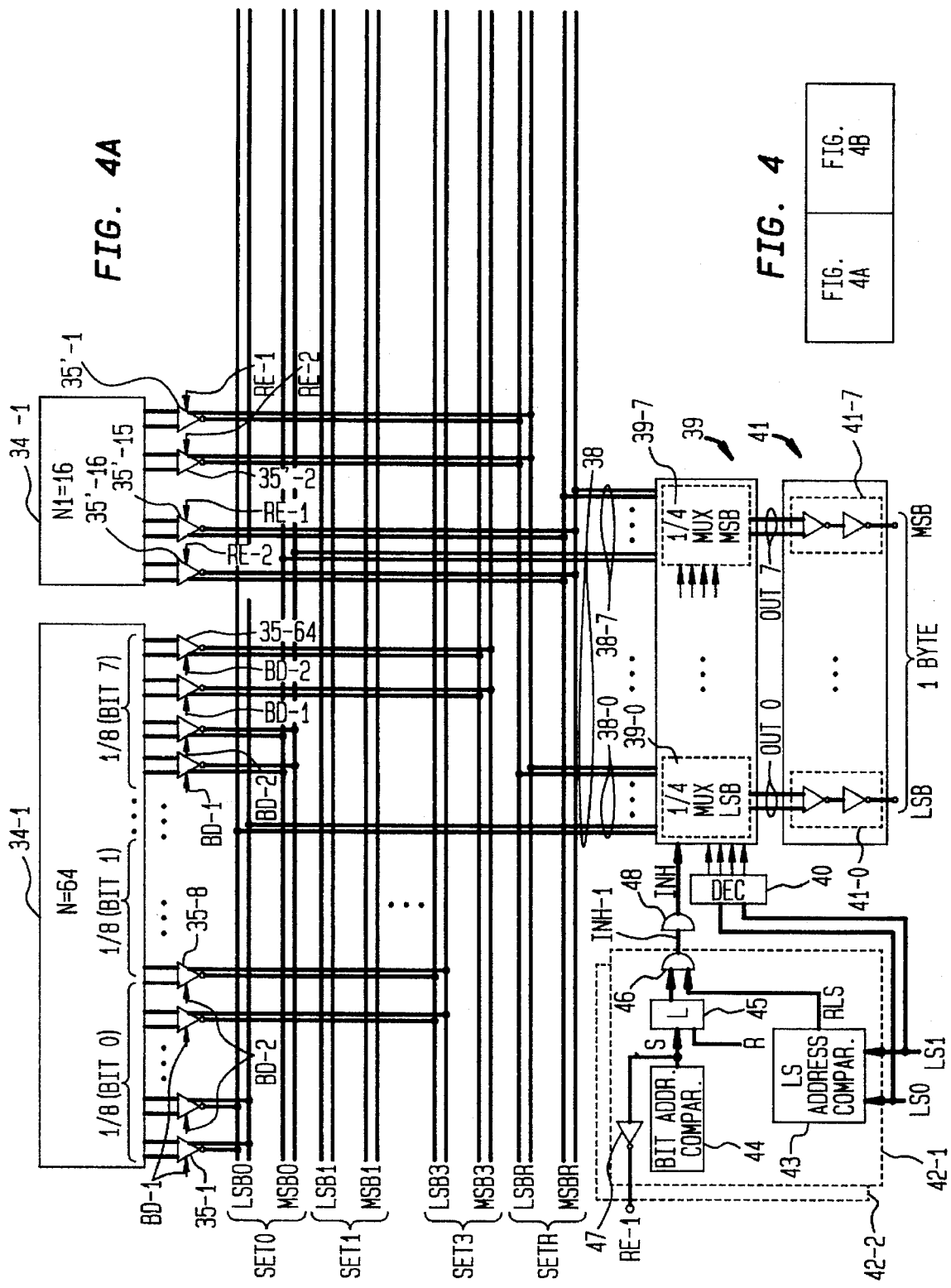

REDUNDANT READ BUS FOR CORRECTING DEFECTIVE COLUMNS IN A CACHE MEMORY

This application is a continuation of application Ser. No. 08/046,324, filed Apr. 15, 1993, now abandoned.

The present invention relates generally to memory circuits and, more particularly, to the implementation of column (or bit line) redundancy in a cache memory architecture.

BACKGROUND OF THE INVENTION

In high density Static Random Access Memories (SRAMs), redundancy is widely used to improve fabrication yield. Redundancy basically involves adding extra word lines and/or extra bit lines to at least one memory sub-array.

As known by those skilled in the art, a memory array includes a plurality of K sub-arrays, each including N pairs of bit lines arranged in columns with memory cells connected therebetween. In a 1-bit wide organization (i.e. 1 output data available), a 1 bit common read bus passes through the whole memory array and the different sense amplifiers are dotted all together thereon. In this case, the bit line or column redundancy is easily implemented by adding a spare sub-array and dotting the redundant sense amplifiers on the common read bus. For instance, if up to 2 defective columns have to be corrected in one memory sub-array, 2 redundant columns have to be added in the spare sub-array. FIG. 1 illustrates this prior art approach.

As shown in FIG. 1, a conventional 1-bit wide memory circuit architecture 10 includes memory sub-array 11-0, which is represented in a typical bit wide organization, wherein the number N of columns is 64. A row of memory cells of sub-array 11-0 is activated for a READ operation by applying an appropriate voltage level on the word line (e.g. WL1), and simultaneously, only one pair of bit lines (e.g. BLT1, BLC1), forming one column over 64, is selected by applying a selection signal (e.g. BD-1) on the corresponding column sense amplifier 12 (e.g. 12-1).

The binary content of the selected memory cell (e.g. MC11) is then read, i.e. the differential voltage appearing between the bit lines is sensed by the corresponding column sense amplifier. Note that the column sense amplifiers of the memory sub-array 11-0 will be referred to below as the normal sense amplifiers. Note also that the WRITE circuitry has not been shown or represented for sake of simplicity. Selection signals BD-1 to BD-64 include bit line (1/64) and memory sub-array (1/K) decode information as known by those skilled in the art. All the output terminals of normal sense amplifiers 12-1 to 12-64 are dotted to a 1-bit common read bus 13. Assuming the sense amplifiers are of the differential type, the common read bus 13 comprises two wires, for the true and complement output signals, as illustrated in FIG. 1. If the sense amplifiers were of the single ended type, only one wire would have been required. A final common sense amplifier and off-chip driver block 14 is connected to the common read bus 13 to generate the 1-bit final output data.

Redundancy is made apparent from FIG. 1 by the presence of a spare sub-array 11'-0 comprised of N'=2 redundant cell columns that are connected in a standard manner to two redundant sense amplifiers 12'-1 and 12'-2 specifically dedicated to redundancy and controlled by selection signals RE-1 and RE-2. The outputs of these redundant sense amplifiers are dotted to the common read bus 13. As a result, all single (or double) failed cell column in memory sub-array 11-0 can be repaired, by substituting one (or two) redundant cell columns to the failed one(s). However, care must be exercised, because normal data and redundant data, respectively generated by the normal and redundant sense amplifiers, are output on the same common bus 13. As a matter of fact, once redundant data must be selected, the normal sense amplifiers of the defective memory cell column must be disabled in order not to mix the respective electrical signals on the common read bus 13. The switching operation between the normal and redundant sense amplifiers is realized by means of the bit (or column) decoding circuitry and also by means of a failed bit address detector or bit address comparator. The bit decoding circuitry is implemented with known multi-layer decoding techniques. A memory chip having no redundant cells is distinct in that one of these decoding layers can be inhibited by a signal which is provided by the bit address comparator. The latter recognizes the occurrence of a failed address previously tested and stored as explained below in a ROM using laser blown fuse techniques. The failed address is programmed (or written) with the help of an on-chip fuse for each address bit weight. Whether or not this fuse is blown depends on the binary identification of a given bit address which may be tested and recognized to exhibit a fail symptom. When all column address bits match with the programmed failed bits, the compare function (XOR function) is done in parallel on each bit and, in that case, a selection signal is generated and referred to as the RE (Redundancy Enable) signal to enable the appropriate redundant sense amplifier, and the corresponding BD signal is disabled.

The byte-wide organization is directly derived from the 1-bit wide organization. In a byte-wide organization, eight output data bits (i.e. a byte) instead of one are generated. Thus, a 8-bit common read bus passes through the whole memory array. The normal sense amplifiers are dotted on this common read bus with respect to their respective bit weight. If a fail occurs in one column of the memory array, that means one bit failed in a byte. The immediate solution (and the easiest from a circuitry point of view) would be to replace the defective byte by a redundant byte. Consequently, to be able to correct two defective columns in the memory sub-array, sixteen redundant columns are then required in the spare array. Such a byte-wide memory circuit architecture is illustrated in FIG. 2, and referred to generally by reference numeral 15.

Referring to FIG. 2, memory sub-array 16-0 is comprised of N=64 columns organized in eight blocks of eight memory cell columns each. A bit of a special weight corresponds to each block. The number of blocks M is determined by the length of the binary word that is selected to organize sub-array 16-0. In the instant case of a byte-wide organization, the word is comprised of eight bits, i.e. M=8. The number of memory cell columns per block, in this instance, eight, is purely illustrative. This number is related to the number of selection signals, and thus to the number of bytes stored in sub-array 16-0. The first eight normal sense amplifiers 17-1 to 17-8 of the differential type, are connected to the first eight memory cell columns of sub-array 16-0 and the outputs are dotted to the first sub-bus 18-0, which is comprised of two wires. These correspond to the first bit (bit 0 or LSB) of the byte to be output. Similar construction applies to other cell column blocks. To output one byte over eight of the memory sub-array, the normal sense amplifiers 17-1 to 17-8 are adequately selected by a selection signal BD-1 to BD-8 for each bit weight. As a result, the common read bus 18 comprises eight 2-wire sub-busses referenced 18-0 to 18-7 to generate the output byte in totality, whose bits are referred to as bit 0 (LSB) to bit 7 (MSB) in FIG. 2. To each sub-bus, e.g. 18-0, corresponds a final sense amplifier connected in series with a buffer to form an element, e.g. 19-0, of a block generically referenced with reference numeral 19. The full output byte is available at the output terminals of the eight elements 19-0 to 19-7.

In this instance, the spare sub-array 16'-0 is now comprised of 2×8=16 columns to be able to still correct two defective columns in memory sub-array 16-0. Spare array 16'-0 therefore comprises sixteen redundant sense amplifiers 17'-1 to 17'-16 that are dotted, two by two, on each of the eight sub-busses 18-0 to 18-7. The redundant sense amplifiers are controlled by two selection signals RE-1 and RE-2 to select up to two redundant bytes stored in the spare sub-array 16'-0 to be output by block 19. Note that, if binary words of 64 bits instead of 8 bits were used, this would mean that the spare sub-array 16'-0 should include 2×64=128 redundant columns.

The above problem of redundancy is even more acute in cache memories. The large performance gap between the central processing unit (CPU) and the main memory has made the use of cache memories an important factor for any present and future high performance processor. In cache memory architectures, the 4-way and 8-way set associative cache organizations are the most extensively used to date in order to meet the high speed objectives of the mainframe manufacturers. In the 4-way set associative cache organization, which is the standard to date, 4 data sets (bit, byte, . . . ) have to be generated by each memory sub-array and one over 4 of these data sets will be subsequently selected through the so-called late select signals LS0 and LS1. In the meantime, this provides a means of initiating additional logical functions (e.g. address translation) in parallel and then to decide later in the system cycle which data set is correct and must be used by the CPU. For example, assuming the data set format is the byte, 4 bytes have to be available at the same time and the final selection is done through a ¼ multiplexer circuit controlled by four control signals derived from the two late select signals via a decoder circuit. Note that, in regard to the other address signals, these two late select signals are valid later in the cycle. As a result, a 32 bit common read bus now has to be used. If 2 defective columns still need to be corrected with the conventional byte-wide organization of FIG. 2, the number of spare cell columns will increase up to 32×2=64, as will now be explained in more detail in conjunction with FIG. 3.

Referring now to FIG. 3, a conventional byte-wide circuit architecture of a 4-way associative cache memory with embedded column redundancy is referred to generally by reference numeral 20. Memory sub-array 21-0 is comprised of N=64 memory cell columns sub-divided in M=8 blocks, which are connected to 64 normal sense amplifiers 22-1 to 22-64. The selection signals are referenced as SEL-1 and SEL-2. With this architecture, four memory data read busses 23-0 to 23-3, each comprised of eight 2-wire sub-busses are required to convey the four byte format data sets: SET0 to SET3. As a result, 32 bits out of 64 are output from sub-array 21-0, depending upon the selection made by selection signals SEL-1 and SEL-2. Still referring to FIG. 3, the two first normal sense amplifiers 22-1 and 22-2, of the first memory cell block, are dotted on the LSB0 sub-bus of bus 23-0, and so on up through normal sense amplifiers 22-7 and 22-8, whose outputs are connected to the LSB3 sub-bus of bus 23-3. Similar construction applies to other cell column blocks. All these connections, i.e. four groups 23-0 to 23-3 of eight 2-wire sub-busses, form main read bus 23.

In order to be able to still correct up to 2 defective columns in sub-array 21-0, the spare sub-array 21'-0 necessitates N'=64 columns. The dedicated redundant sense amplifiers are referenced 22'-1 to 22'-64. The two first redundant sense amplifiers 22'-1 and 22'-2 are connected to the LSB0 sub-bus of bus 23-0, and so on up through redundant sense amplifiers 22'-63 and 22'-64, that are connected to the MSB3 sub-bus of bus 23-3. Likewise, the selection signals are referenced RE-1 and RE-2.

The circuitry which will be described below is an example of a conventional design using standard logic circuits that could be implemented to render operative the memory cache circuit architecture of FIG. 3. All four LSB sub-busses LSB0 to LSB3 are connected via bus 24-0 to a ¼ multiplexer element 25-0, and so on for each bit weight, until the MSBs are reached, as shown in FIG. 3. The eight ¼ multiplexer elements 25-0 to 25-7 are grouped in multiplexer block 25. The multiplexer block 25 is controlled by a combination of the late select signals LS0 and LS1 via a ¼ decoder circuit 26. Each one of the eight multiplexer element outputs is connected to a sense amplifier/buffer element 27-0 to 27-7, respectively, whose assembly forms block 27. The selected full byte is available at the output terminals of the elements 27-0 to 27-7. Selection signals SEL-1 and RE-1 are generated by circuit 28-1 comprised of conventional components: a RS flip-flop latch 29, a bit address comparator 30, a 3-way AND gate 31, and an inverter 32. The output of bit address comparator 30 is applied to the SET (S) input of latch 29. Signal BR-1 which is output by latch 29 is applied to one input of the 3-way AND gate 31 and selection signal BD-1 (as defined above with respect to FIGS. 1 and 2) is applied to its other input. The signal which is output by AND gate 31 is referenced SEL-1, while signal RE-1 is derived from signal BR-1 via inverter 32. A symetric circuit 28-2 generates signal BR-2 and selection signals SEL-2 and RE-2. Signal BR-2 is also applied to one input of the 3-way AND gate 31 of circuit 28-1. Similarly, signal BR-1 is applied to the corresponding 3-way AND gate of circuit 28-2. In such 4-way set associative cache SRAMs, wherein the bit addresses are only valid during a short period of time and usually are no longer valid when the late select address bits occur, the role of latch 29 is thus to "memorize" a given logic state when the bit address comparator 30 recognizes a faulty address combination stored therein. As known by those skilled in the art, bit address comparator 30 is fed with the column address bits from the CPU and compared with a table of defective addresses stored in a ROM. With standard memory architectures such as illustrated in FIGS. 1 and 2, latch 29 would not be necessary.

Although described in a 4-way set associative cache memory organization, the architecture of FIG. 3 could be generalized to a P-way set associative cache memory as well, wherein P=8, 16, . . . Note that in this case, the number of read busses and data sets is still equal to P. Finally, FIG. 3 also illustrates other memory sub-arrays, e.g. 21-1 to 21-K, and corresponding optional spare arrays 21'-1 to 21'-K.

Operating behavior of the cache memory architecture of FIG. 3 will now be briefly described. An electrical signal is developed on the 64 bit line pairs or columns corresponding to a given decoded row of the memory sub-array 21-0. 32 normal data out of 64 forming the four data sets SET0 to SET3 are selected by the normal sense amplifiers addressed by the appropriate selection signal i.e. either SEL-1 or SEL-2. The two following cases are to be considered depending upon whether or not redundant replacement is required.

In the first case, at least one selected cell column is defective. This implies that redundancy replacement is required. The bit address comparator 30 detects a match between the bit (or column) address provided to the memory by the CPU and the bit address stored as corresponding to a defective column of memory sub-array 21-0. The normal sense amplifiers corresponding to the 32 data wherein at least one faulty data has been recognized, are disabled by means of the BR signals (because latches 29 in circuits 28-1 and 28-2 are now reset), thereby preventing the corresponding selection signal (SEL-1 or SEL-2) to turn on any of them. Reciprocally, either the RE-1 or RE-2 selection signal is activated in order to turn on one of the groups of 32 redundant sense amplifiers to output 32 valid data. The reading of sub-array 21'-0 is achieved in the same way as for the reading of the memory sub-array 21-0. Finally, the LS0 and LS1 signals are delivered to the multiplexer elements 25-0 to 25-7, via decoder circuit 26, to select 8 data out of 32 to output the final byte.

In the second case, the selected cell columns in the memory sub-array 21-0 are free from any defect, and thus there is no need for redundancy replacement. Signal BD-1 (or BD-2) is not inhibited by the bit redundancy BR signal, because latch 29 has not been set. Next, 8 data out of 32, i.e. one data set among SET0 to SET3, are selected by means of the eight ¼ multiplexer elements 25-0 to 25-7 driven by the 4 decoded LS0/LS1 signals to output the desired final 8 data. It must be noticed that with the implementation shown in FIG. 3, the redundant sense amplifiers are connected to the read busses 23-0 to 23-3. Therefore, they must be isolated therefrom when there is no defective columns in sub-array 21-0. This isolation is made through signals RE-1 and RE-2, which are forced to zero. Indeed, circuits 28-1 and 28-2 generate adequate RE-1 and RE-2 signals so that the two groups of 32 odd and even redundant sense amplifiers: 22'-1 to 22'-63 on the one hand, and 22'-2 to 22'-64 on the other hand, are inhibited.

The above implementation of column redundancy in a cache memory as described in conjunction with FIG. 3 exhibits some deficiencies.

A major inconvenience is the size of the spare array which increases from 16 (FIG. 2) to 64 columns (FIG. 3) in a 4-way set associative cache implementation. As a consequence, in that instance, the size of the spare array 21'-0 is the same as that of the memory sub-array 21-0.

Moreover, the number of redundant columns is dependent on the number of the late select signals. A 4-way set associative cache memory requires two LS address signals: LS0 and LS1 and thus four decoded LS address signals are generated at the output of decoder 26. Should P=8, i.e. a 8-way implementation adopted, this would imply three LS address signals and thus eight decoded LS address signals instead of four, the number N of cell columns in the spare array 21'-0 would then increase to 128. In all respects, the solution of FIG. 3 would become rapidly prohibitive from a consumed silicon area point of view and in terms of circuit complexity.

In addition, the decision to use the redundant or the normal 32 data depends on the content of an address whose 2 bits are the late select bits, that are determined only late in the system cycle. As explained above in conjunction with the first case, if redundancy is required, it is necessary to activate the redundant sense amplifiers, then to drive the multiplexer elements before the selected byte (normal or redundant) is output. Therefore, as the late select access time must be very short, it becomes more and more difficult to implement the column redundancy in cache memories without adding extra delay.

For the reasons outlined above, heretofore, there has been no known cache memory, which efficiently implements column redundancy. Consequently, only word line redundancy has been widely used so far in standard cache memory architecture.

OBJECTS OF THE INVENTION

Therefore, it is a primary object of the present invention to provide an efficient implementation of column redundancy in a cache memory architecture.

It is still another object of the present invention to provide column redundancy in a cache memory architecture whose operation is independent of the number of late select signals.

It is further another object of the present invention to provide implementation of column redundancy in a cache memory architecture whose spare array size is only determined by the number of defective cell columns to be replaced in the memory sub-array.

It is another object of the present invention to provide implementation of column redundancy in a cache memory architecture that is able to generate the redundant byte without extra delay.

SUMMARY OF THE INVENTION

Generally, the present invention relates to efficiently implementing column redundancy in a cache memory architecture to reach high speed performance.

The invention basically involves the use of a separate redundant read bus fully dedicated to redundancy, fed by a single spare sub-array which is common to all the memory sub-arrays of the cache memory. As a result, the redundant sense amplifiers are no longer dotted with the normal sense amplifiers on a common read bus. The redundant sense amplifiers are dotted to the redundant read bus and the normal sense amplifiers are connected to a main read bus comprised of 4 read busses in the case of a 4-way set associative cache memory organization. Consequently, both the normal and redundant 32 data are valid and available at the same time at the outputs of the normal and redundant sense amplifiers, i.e., on the main and redundant read busses respectively. When the two late select address signals LS0 and LS1 become valid, then the correct information, i.e. the correct 8 data among the 32 to be output, can be immediately selected via a ¼ multiplexer provided with an INHIBIT (INH) input. The multiplexer is normally controlled by the four decoded signals (derived from the two late select address signals) generated by a decoder, unless redundancy is required. In this case, the information generated by the bit address comparator and stored in a latch, combined with the information generated by a late select address comparator, forces the multiplexer via the INHIBIT input, to select the redundant read bus instead of one read bus of the main read bus, to output the redundant byte as the selected one.

With this implementation, the number of redundant cell columns do not increase with the number of late select address signals that are used.

It is preferable to use a very high speed late select address comparator circuit to improve the overall access time, because this circuit intervenes in the critical path of the cache memory architecture and because the final fetch decision is done later in the cycle. To that end, an appropriate high speed LS address comparator circuit is also described in more detail hereinbelow.

BRIEF DESCRIPTION OF THE DRAWINGS

These and other objects, features, aspects and advantages will be more readily apparent and better understood from the following detailed descripton of the invention, in which.

DETAILED DESCRIPTION OF THE PREFERRED EMBODIMENT

Figure 1:
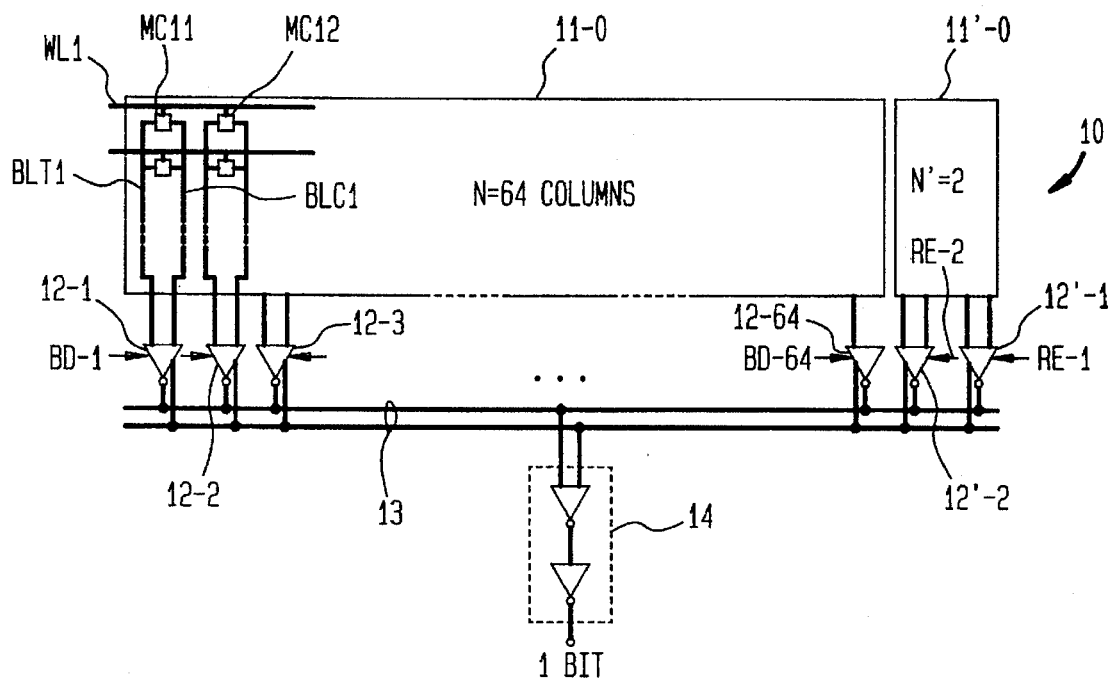
FIG. 1 shows the prior art implementation of column redundancy in a standard 1-bit wide SRAM memory architecture.
Figure 2:
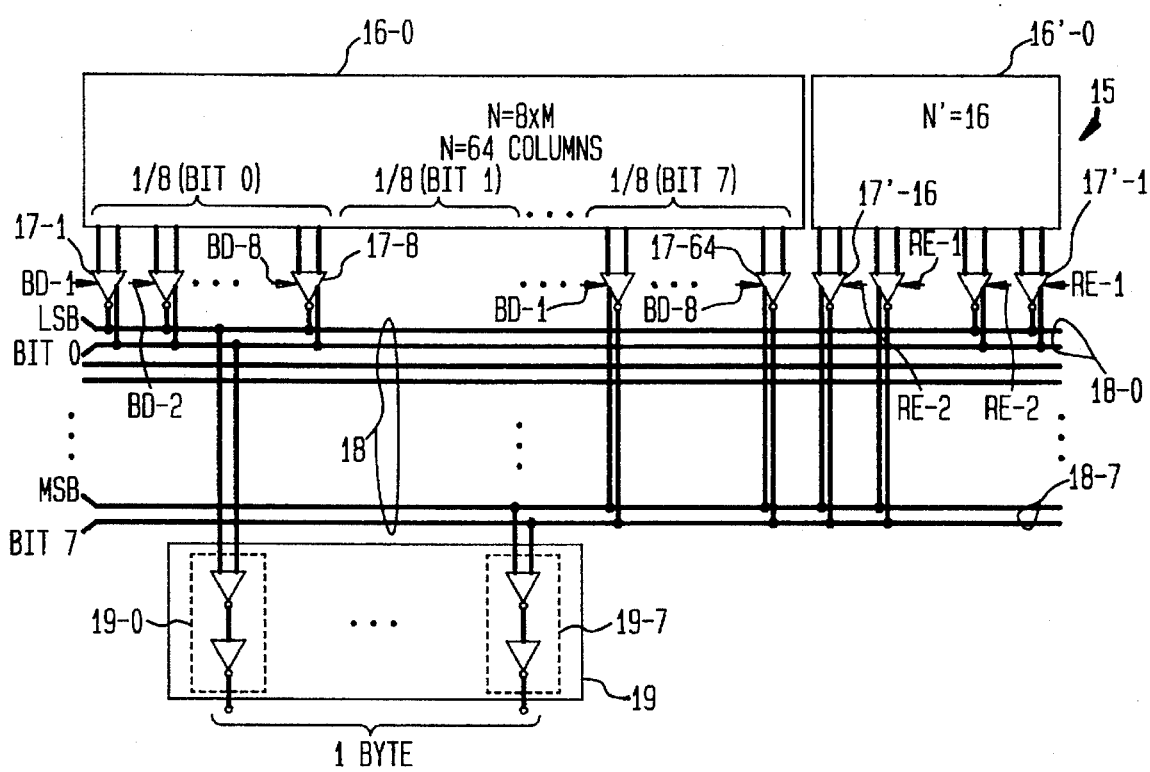
FIG. 2 shows the prior art implementation of column redundancy in a standard byte-wide SRAM memory architecture.
Figure 3:
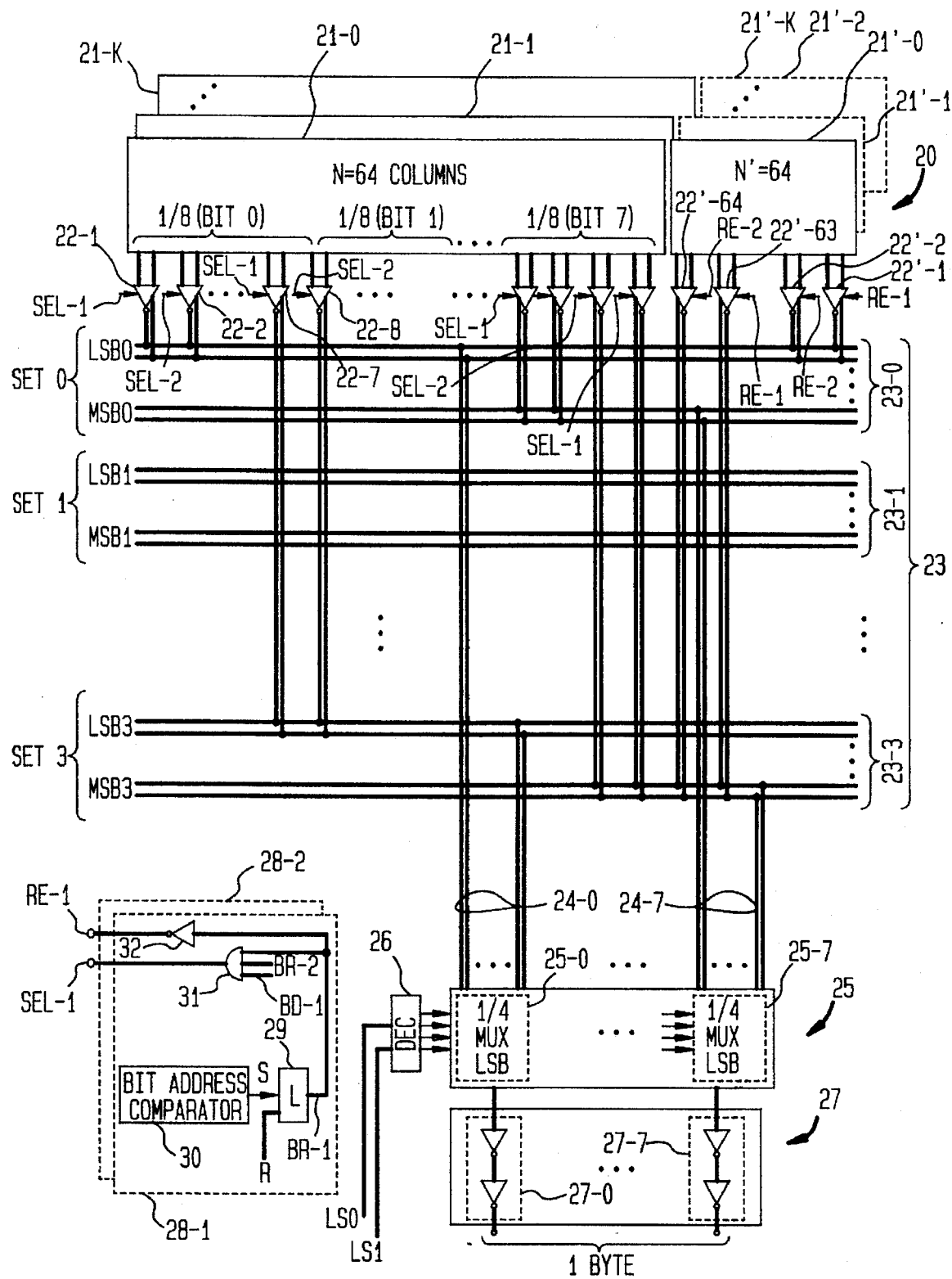
FIG. 3 shows the implementation of FIG. 2 when adapted to fit the specific requirements of a 4-way set associative cache organization.
Figure 4B:
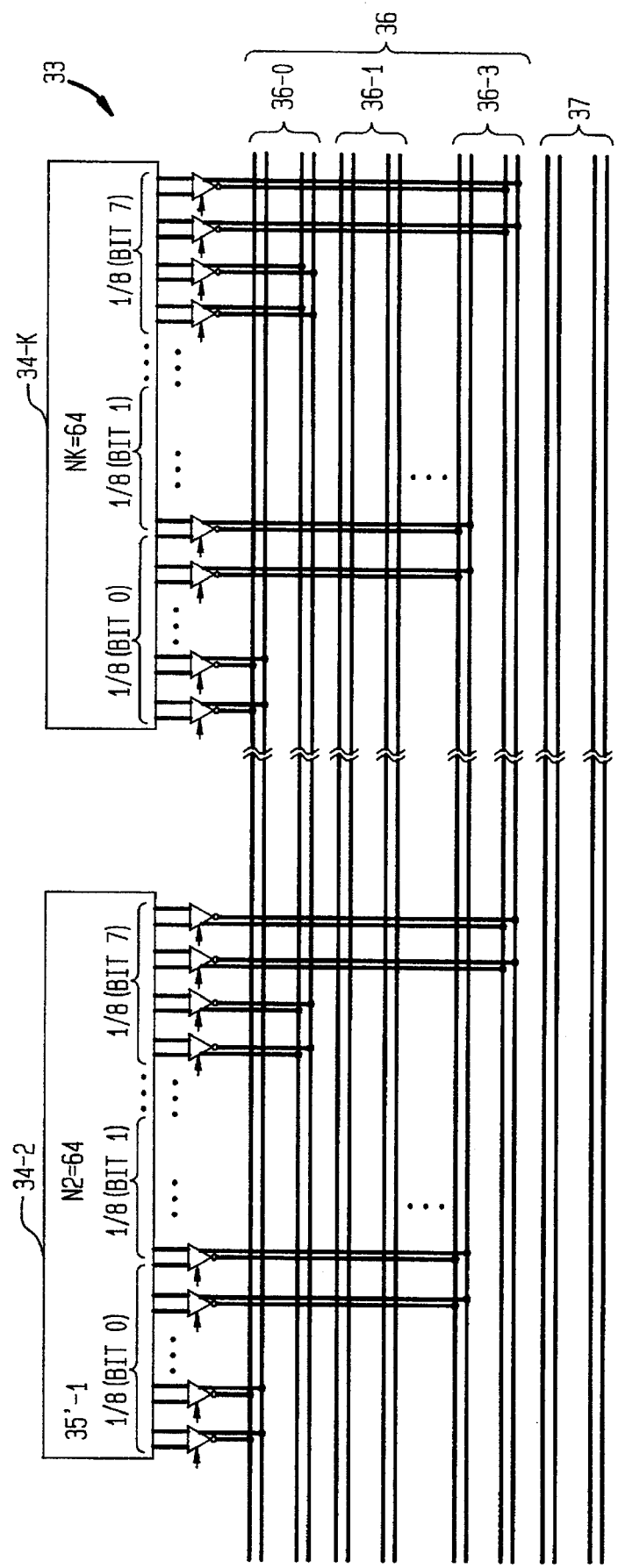
FIG. 4 (which includes FIG. 4A and FIG. 4B) shows the implementation of column redundancy in a byte-wide 4-way set associative cache memory architecture according to the basic principle of the present invention mainly based on the use of a separate redundant read bus.

Referring initially to FIG. 4, there is shown an implementation of column redundancy in the 4-way set associative cache memory architecture in accordance with the present invention. The architecture is referred to generally by numeral 33, all N1=64 cell columns of memory sub-array 34-1 are connected via normal sense amplifiers 35-1 to 35-64 to four read busses 36-0 to 36-3 corresponding to the four data sets SET0 to SET3, respectively, in similar manner to that described above in conjunction with FIG. 3. The bundle of read busses 36-0 to 36-3 constitutes the main read bus 36. Likewise, all other memory sub-arrays 34-2 to 34-K are similarly connected to the four read busses. According to the present invention, the memory architecture 33 is provided with a separate redundant read bus 37 and a single spare sub-array 34'-1 that are both common to all memory sub-arrays 34-1 to 34-K. Spare sub- array 34'-1 comprises N'=16 cell columns and is able to replace up to two defective cell columns in any of the memory sub-arrays. The two first redundant sense amplifiers 35'-1 and 35'-2 are connected to the LSB sub-bus referenced LSBR of redundant read bus 37, and so on, two by two, until the two last redundant sense amplifiers 35'-15 and 35'-16, which are dotted to the MSB sub-bus MSBR of bus 37. All LSB sub-busses LSB0 to LSB3 are connected via output bus 38-0 to ¼ multiplexer element 39-0 having an INHIBIT (INH) input, and so on for each bit weight, until the MSBs are reached. The bundle of output busses 38-0 to 38-7 constitutes the main output read bus 38. In addition to these connections, each sub-bus of the redundant read bus 37, is also connected to its corresponding multiplexer element depending on its bit weight, e.g. sub-bus LSBR is connected (as part of sub-bus 38-0) to multiplexer element 39-0. All the multiplexer elements 39-0 to 39-7 forming multiplexer block 39 are controlled by the four decoded LS address signals generated by decoder circuit 40 and by the INH signal, as will be explained below. Each output of the multiplexer elements 39-0 to 39-7 is connected, via a data out wire OUT 0 to OUT 7 to its corresponding final sense amplifier/buffer element 41-0 to 41-7 which are grouped to form block 41, where the final byte to be output is available. The circuits referenced 28-1 and 28-2, shown and described in conjunction with FIG. 3, are now adapted because of the presence of redundant read bus 37. Unlike circuit 28-1 (28-2) in FIG. 3 which was concerned with the generation of a specific selection signal SEL-1 (SEL-2), the normal sense amplifiers 35-1 to 35-64 are now directly driven by the bit decode signals BD-1 and BD-2. The redundant sense amplifiers are still driven by selection signals RE-1 or RE-2. Logic circuit 42-1 comprises LS address comparator 43 driven by the late select address signals LS0 and LS1, to generate a redundant late select (RLS) signal, bit address comparator 44, RS flip flop latch 45 and 2-way AND gate 46. Structure and function of bit address comparator 44 are similar to the conventional bit address comparator 30 of FIG. 3. The output of bit address comparator 44 is connected to the SET input S of latch 45, whose output is connected to one input of 2-way AND gate 46. Signal RE-1 corresponds to the signal which is output by bit address comparator 44 after inversion in inverter 47. RLS signal which is output by LS address comparator 42 is applied to the other input of AND gate 46. Circuit 42-2 has a similar construction to generate RE-2 and INH-2 signals, which are ORed in 2-way OR gate 48. The signal that is output by the OR gate 48, referred to as INH signal, is applied to the INH input of each of the multiplexer elements of block 39, in addition to the four decoded LS address signals as mentioned above.

With the implementation of FIG. 4, the two redundant bytes of spare sub-array 34'-1 may be substituted for any pair of defective bytes irrespective of the memory sub-array 34-1 to 34-K in which they are located.

Operating behavior of cache memory architecture of FIG. 4 will be described hereinafter. The circuits shown in FIGS. 5 and 6 are described below.

Figure 5:
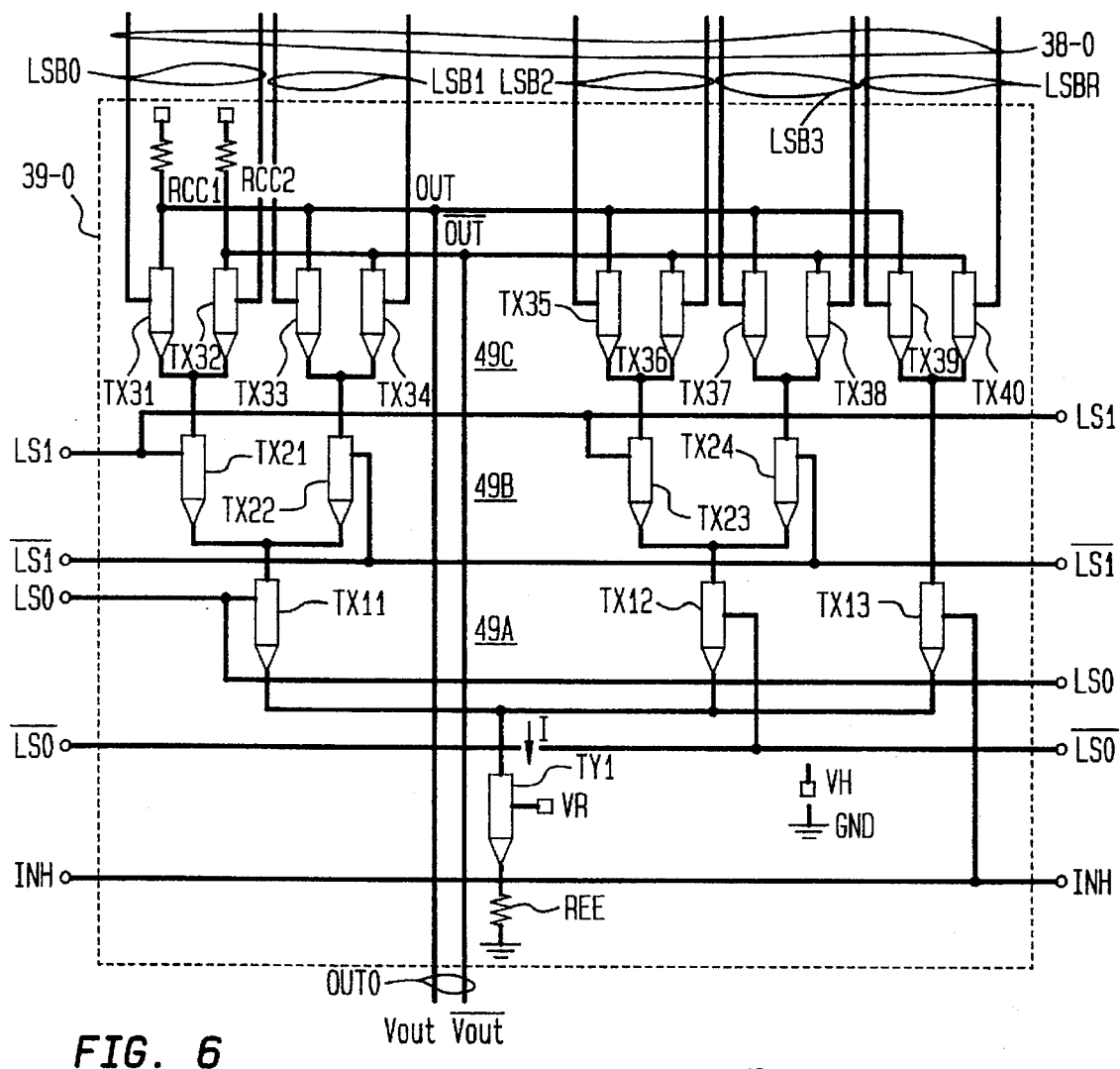
FIG. 5 shows the detailed structure of a ¼ multiplexer with an INHIBIT function that can be used as part of the memory architecture of FIG. 4.
Figure 6:
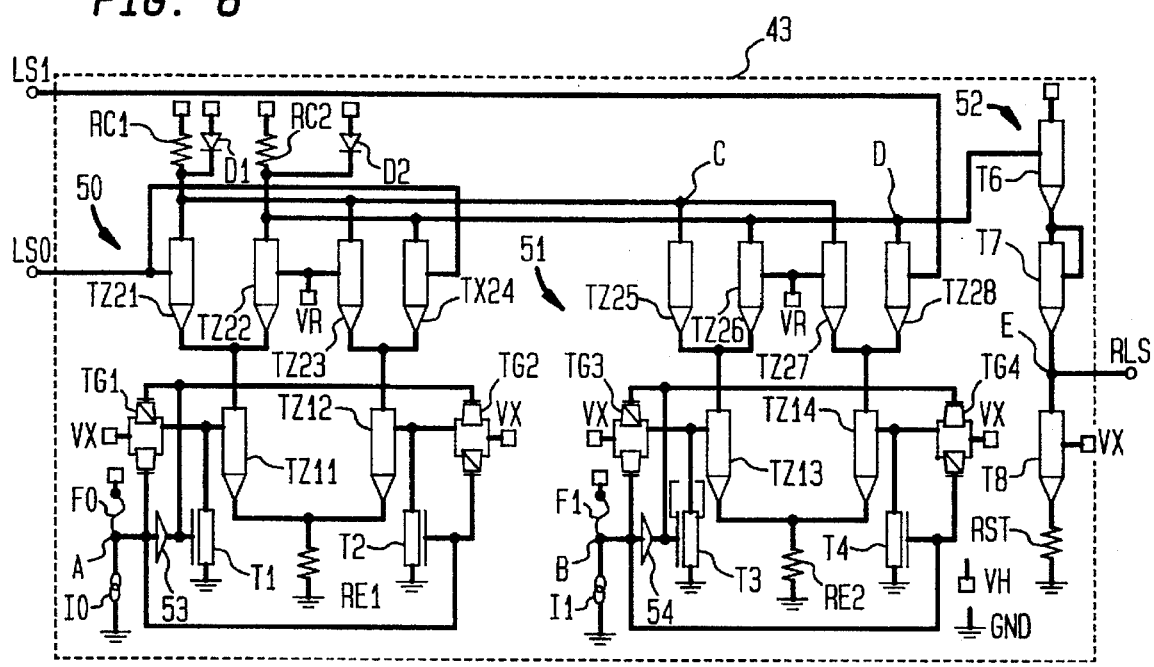
FIG. 6 Shows a high speed BiCMOS late select address comparator that can be used as part of the memory architecture of FIG. 4 for high speed performance.

FIG. 5 shows a ¼ multiplexer element appropriate for FIG. 4 with an INH input, typically element 39-0, which handles the LSB bits. It basically comprises a three-level cascode current switch logic tree, driving two emitter-follower circuits (not shown) to supply the complementary circuit output signals: respectively, the IN PHASE Vout and OUT OF PHASE Vout signals at wires referenced OUT 0. Circuit 39-0 is biased between a first supply voltage, a positive voltage VH=5V, and a second supply voltage, the ground GND. The logic tree comprises bottom, middle and top stages 49A, 49B and 49C dotted at the tree output nodes OUT and $\overline{OUT}$. Each current switch comprises a pair of input transistors connected in a differential amplifier configuration. As far as the first pair of LSB bits are concerned, i.e. LSB0 and LSB1, the bottom stage 49A at the first level comprises input transistor TX11 which is driven by signal LS0. At the second level, middle stage 49B comprises input transistors TX21 and TX22 driven by signals LS1 and $\overline{LS1}$. Finally, at the third level, top stage 49C comprises four input transistors TX31 to TX34. The bases of transistors TX31 and TX32 are connected to read sub-bus LSB0 and the bases of transistors TX33 and TX34 are connected to read sub-bus LSB1. The common collector of transistors TX31 and TX33 is connected to load RCC1 with output node $\overline{OUT}$ connected therebetween. The common collector of transistors TX32 and TX34 is connected to load RCC2 with output node OUT connected therebetween. The bottom stage is supplied by a constant current I, determined by a conventional current source comprised of transistor TY1, the base of which is connected to a fixed reference voltage VR (delivered by a reference voltage generator not shown) and resistor REE. The constant current, given by relation I=((VR-VBE(TY1))/REE), flows through either transistors TX11 and TX21 or TX22 and one transistor over four of the third stage. At any stage, the constant current flows through the transistor which receives the highest base voltage. Similar construction and reasoning apply to read sub-busses LSB2 and LSB3, with transistor TX12 in the bottom stage, transistors TX23 and TX24 in the middle stage, and transistors TX35 to TX38 in the top stage. Circuit 39-0 further comprises transistors TX13 in the bottom stage and transistors TX39 and TX40 in the top stage for the INHIBIT function. The base of transistor TX13 is driven by the INH signal; its emitter is dotted with the common emitter of transistors TX11 and TX12. The collector of transistor TX13 is dotted with the emitters of transistors TX39 and TX40, whose bases are connected to the 2-wire read sub-bus LSBR. The collectors of transistors TX39 and TX40 are tied to nodes OUT and $\overline{OUT}$, respectively.

When no redundancy is required, the INH signal is lower than any LS0 or $\overline{LS0}$ signal (by construction), and transistors TX13, TX39 and TX40 are off. The redundant sub-bus LSBR is therefore isolated from output nodes OUT and $\overline{OUT}$. It remains a conventional cascode based multiplexer whose conductive transistors are determined by the voltage levels of the four decoded signals LS0, $\overline{LS0}$, LS1 and $\overline{LS1}$. Depending upon the levels, one out of four sub-busses LSB0 to LSB3 will be connected to the output nodes for data transfer on the two wires referenced OUT 0.

On the contrary, when redundancy is required, the INH signal is superior to any LS0 or $\overline{LS0}$ signal, and current I flows through TX13, then in either transistor TX39 or TX40 depending on the data present on the LSBR sub-bus, while transistors TX11 and TX12 are off. The data present on the LSBR sub-bus is output to output nodes OUT and $\overline{OUT}$ for being transferred.

FIG. 6 shows the schematic of a high speed BiCMOS late select address comparator 43 that can be advantageously used in the memory architecture of FIG. 4. This circuit is very fast because of its cascode construction. Now turning to FIG. 6, late select address comparator 43 (implemented in a BiCMOS technology that offers the process steps necessary to produce polysilicon-chromium microfuses), is able to detect one defective cell column address. It comprises two identical elementary circuits 50 and 51 each driven by LS signals LS0 and LS1, and including a specific fuse F0 and F1, respectively. Basically, circuit 50 is formed with well known collector dotted transistors forming a two-level current switch cascode. In the bottom level, transistors pair TZ11 and TZ12 has its common emitter loaded by resistor RE1 connected to GND. In the first half of circuit 50, the base of transistor TZ11 is connected to a transfer gate TG1 whose other connection is tied to VX, a reference voltage. The common node A formed between fuse F0, tied to VH, and a current source 10 is connected to one gate electrode of the transfer gate TG1 and via inverter 53, and transfer gate TG1 and via inverter 53 are both connected to the other gate electrode of TG1 and the gate electrode of FET T1. FET T1 is connected in parallel between the base of transistor TZ11 and the ground, and its role is to prevent the base from being floating, but preferably maintained at a potential close to GND. Similar complementary construction applies to the second half of circuit 50 for transistor TZ12, FET T2 and transfer gate TG2, still driven by the potential of node A.

Collectors of transistors TZ11 and TZ12 are respectively connected to the emitters of transistors TZ21 and TZ22 on the one hand, and transistors TZ23 and TZ24 on the other hand. The bases of transistors TZ21 and TZ24 are connected to signal LS0, while the bases of transistors TZ22 and TZ23 are tied to VR. Collectors of transistors TZ21 and TZ23 are dotted and loaded by resistor RC1 in parallel with antisaturation diode D1 at node C. Likewise, collectors of transistors TZ22 and TZ24 are dotted and loaded by resistor RC2 in parallel with diode D2, this latter connection forming node D. Similar construction applies to circuit 51 as illustrated by FIG. 6, and the dotted collectors of transistors TZ25 and TZ27 on the one hand, TZ26 and TZ28 on the other hand are respectively connected to nodes C and D.

Emitter follower output stage 52 is comprised of transistors T6 and T8 connected in series with output node E coupled therebetween. The base of transistor T6 is connected to node D. The base of transistor T8 is tied to Vx and its emitter loaded by resistor RST. Diode connected transistor T7 operates as a voltage shifter for transistor T6 emitter potential. The signal RLS which is output by circuit 43 is available at node E thereof. One current source TZ11 or TZ12 in conjunction with resistor RE1, and one current source TZ13 or TZ14 in conjunction with resistor RE2, are made active according to the value exhibited by the two fuses F0 and F1 (blown or unblown). Transfer gates TG1 or TG2 and TG3 or TG4 show low or very high impedance value depending on whether or not F0 or F1 have been laser blown, respectively. Consequently, current sources TZ11 and TZ12 are mutually exclusive; it is the same for current sources TZ13 and TZ14. The signal that results from the comparison between the LS0/LS1 signals and the bit configuration stored in the F0/F1 fuses appears at node D. For any of the four F0/F1 combinations, there will be only one LS0/LS1 signal combination where no current is pulled at node D. In this case, voltage at node D is very close to VH. The output signal RLS at node E will be derived from this signal appearing at node D minus two Vbe's.

For example, assuming that the fuses F0 and F1 are not blown, node A and B each have potential equal to VH. As a result, the VX supply voltage is applied to the base of transistors TZ11 and TZ13 that are turned on, while transistors TZ12 and TZ14 are turned off. The current flowing through TZ11 flows in transistors TZ21 or TZ22 depending on LS0 signal voltage>VR, or LS0 signal voltage<VR, respectively. The current flowing through TZ13 flows in transistors TZ25 or TZ26 depending on LS1 signal voltage>VR or LS1 signal voltage<VR, respectively. Consequently, node D is always low (VH-Vbe (D1)) except if LS0 and LS1 signals are at a high voltage. In the latter case, node D potential is equal to VH, and RLS signal is high (logic 1). The redundancy scheme is used as soon as the output level of bit address comparator 44 is high.

The detailed truth table of comparator 43 given below illustrates the other situations:

| F0 | F1 | LS0 | LS1 | RLS |
|---|---|---|---|---|
| blown | blown | 0 | 0 | 1 |
| blown | blown | 0 | 1 | 0 |
| blown | blown | 1 | 0 | 0 |
| blown | blown | 1 | 1 | 0 |
| blown | — | 0 | 0 | 0 |
| blown | — | 0 | 1 | 1 |
| blown | — | 1 | 0 | 0 |
| blown | — | 1 | 1 | 0 |
| — | blown | 0 | 0 | 0 |
| — | blown | 0 | 1 | 0 |
| — | blown | 1 | 0 | 1 |

-continued

| F0 | F1 | LS0 | LS1 | RLS |
|----|----|-----|-----|-----|
| —  | blown | 1 | 1 | 0 |
| —  | —  | 0 | 0 | 0 |
| —  | —  | 0 | 1 | 0 |
| —  | —  | 1 | 0 | 0 |
| —  | —  | 1 | 1 | 1 |

Thus, RLS signal is high (i.e. equal to VH-Vbe (T6)-Vbe (T7)) if the late select address signals LS0 and LS1 have been recognized by the comparator, as explained above. Only if these two LS0 and LS1 signals are high, the redundancy is used.

Figure 7:
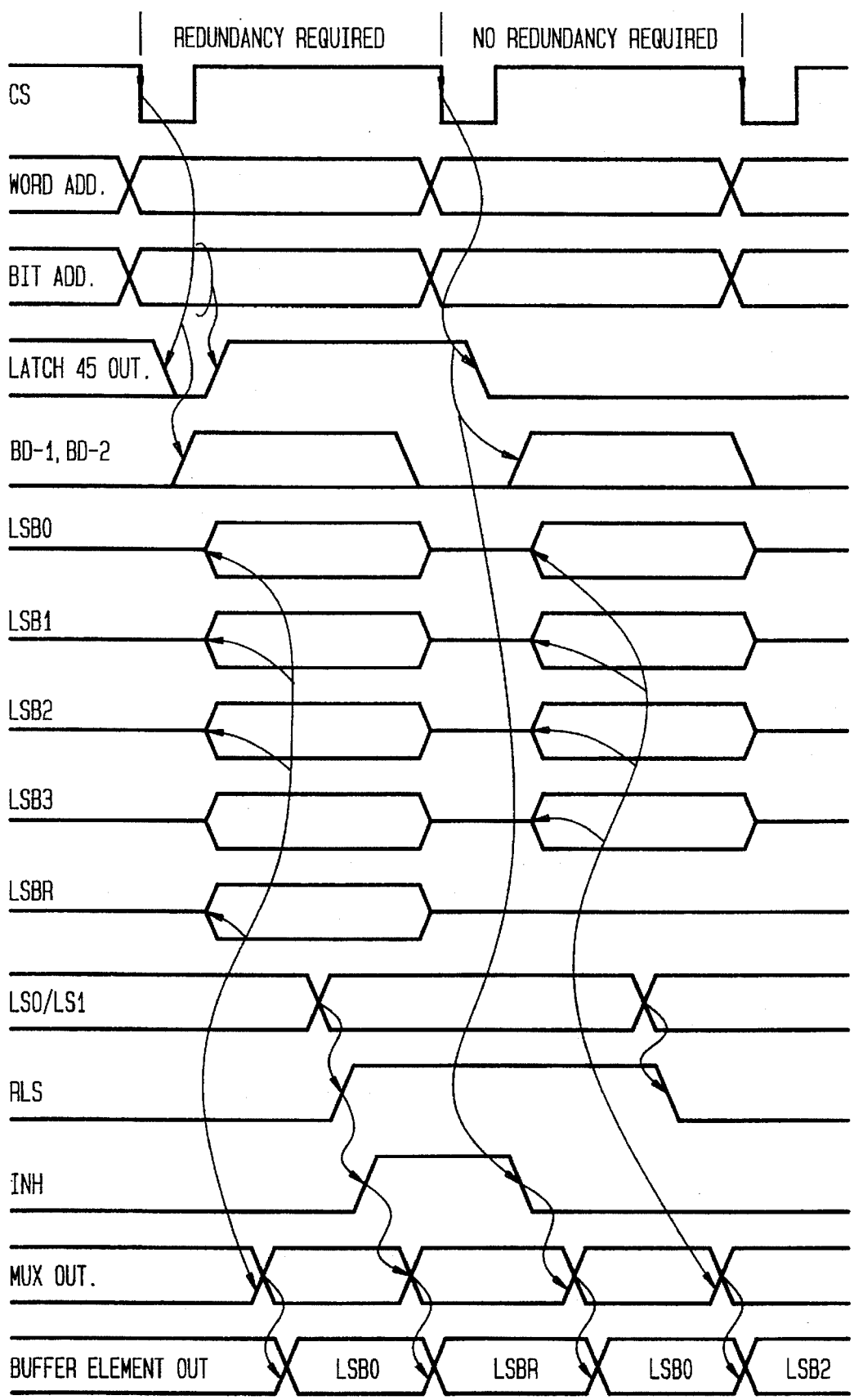
FIG. 7 illustrates the timing diagram which shows the various signal waveforms at different nodes/terminals of the cache memory architecture of FIG. 4.

Overall operation of the novel cache memory architecture of the present invention will be better understood in conjunction with FIG. 7, which shows the timing diagram thereof.

A memory operation starts on the leading edge transition of the clock system CS signal (down-going transition). Memory operation is completed by means of self-timing and pulsed circuit techniques. The description of the different phases which contribute to the memory operation will be discussed now whether bit redundancy is used or not.

In the first system cycle we will assume that the bit redundancy circuits have to be used, on the contrary in the second cycle, where we assume that the normal circuits are used, i.e. redundant cells data are not transferred through the multiplexer.

Bit redundancy used (left side of FIG. 7):

The leading edge of signal CS activates a number of different functional circuits in parallel. It resets the RS flip-flop latch 45 (or leaves it reset when the bit redundancy has not been used in the previous cycle) and triggers the word and bit address decoding operation. One result of this address decoding is the selection of one of the BD-1 or BD-2 signals in a given sub-array (one out of K). In parallel, the bit address is compared with up to two failed bit addresses stored in the bit address comparator 44. In the present case, the comparison result will be positive, then latch 45 will be set and either RE-1 or RE-2 signal will be activated, thus allowing 8 out of 16 redundant sense amplifiers (35'-1 to 35'-16) to transfer the cell data content on the redundant read bus 37. Note that, when the redundancy is used, both the normal read busses and redundant bus are activated and propagate their respective cell content. In FIG. 7, only the LSB signals on the read sub-busses LSB0 to LSB3 and redundant sub-bus LSBR are shown for sake of illustration. Later in the cycle, the two valid LS0 and LS1 signals are applied. LS0 and LS1 signals are compared in the LS comparator 43, as explained in conjunction with FIG. 6, then the RLS signal is raised and finally the INH signal will activate multiplexer element 39-0 in such a manner that the redundant data LSBR is transferred to the sense amplifier/buffer element 41-0 output, as the desired final output signal. Generalization to the full byte SETR can be readily deduced from the above.

Bit redundancy not used (right side of FIG. 7):

The leading edge of signal CS resets the RS flip-flop latch 45, which was set in the previous cycle due to bit redundancy utilization. Down-going transition of CS signal still triggers the word and bit address decoding operation. As previously described, BD-1 or BD-2 signal is activated in a selected given sub-array. Bit address is compared with the two failed bit address stored in the bit address comparator 44, but now the comparison result is negative, thus latch 45 is kept reset and neither RE-1 or RE-2 signal will be activated. As a consequence, none of redundant sense-amplifiers (35'-1 to 35'-16) is powered-up. Later in the cycle, the two valid LS0 and LS1 signals are applied. LS0 and LS1 signals are compared within LS comparator 43, but in this case, the INH signal will stay at a low level irrespective the RLS signal is raised or not. Consequently, the multiplexer element 39-0 will use a normal ¼ path and will transfer one data among the four read sub-busses LSB0 to LSB3 to the output, for instance, data LSB2 as illustrated in FIG. 7.

In summary, the proposed architecture enables selection of both normal and redundant columns if a faulty bit address is recognized by the bit address comparator. The final decision being made subsequently by the combination of late select address signals that are valid later. The disclosed architecture has the following advantages from a performance point of view.

1) It does not increase the address and late select access time.

2) It does not increase the number of spare columns compared with a classical SRAM design. For instance, to correct 2 single faults, only 16 spare columns are required if a byte-wide 4-way set associative cache memory organization is used.

3) The number of spare columns do not depend on the late select address signal number.

While the invention has been described in terms of specific embodiments, it is evident in view of the foregoing description that numerous alternatives, modifications and variations will be apparent to those skilled in the art. Thus, the invention is intended to encompass all such alternatives, modifications and variations which fall within the scope and spirit of the invention and the appended claims.

We claim:

1. A P-way associative cache memory provided with a system clock, comprising:

P memory read busses, each of said busses transporting memory data sets, each of said memory data sets being M bits long;

at least one word-wide organized memory sub-array comprising memory cell columns arranged in q words, each word being M bits long, said memory sub-array being coupled to one of said memory read busses and being controlled by a first set of control signals that enables said memory data sets to be available at said memory read busses;

a first set of sense amplifiers coupling one of said columns to one of said P memory read busses;

a single redundant read bus for handling redundant data sets, each said redundant data sets being M bits long;

one redundant memory sub-array comprising columns, said redundant memory sub-array being coupled to said redundant read bus and being controlled by a second set of control signals that enables said redundant data sets to be available at said redundant read bus;

a set of redundant sense amplifiers, wherein each of said redundant sense amplifiers is coupled to one of said columns of said redundant memory sub-array and to said single read bus;

P multiplexers respectively coupled to said P memory read busses, to said single redundant read bus and controlled by decoder means, said multiplexers being responsive to signals provided by said memory read busses and by said redundant read bus, said decoder means for generating signals to control said multiplexers; being provided with at least one input and a plurality of outputs, said outputs generating decoding signals that selectively activate at least one of said multiplexers, and said at least one input provides said decoder with late select address signals; and at least one logic circuit responsive to defective columns in said at least one memory sub-array, said logic circuit generating a signal for selectively inhibiting said multiplexers, wherein said at least one logic circuit comprises:

a bit address comparator means identifying an address corresponding to a defective column in said at least one memory sub-array; and a late select signal address comparator means generating a redundant late select address signal in response to said late select address signals, said identified address corresponding to said defective column and, generated redundant said late select address signal controlling said generation of said inhibit signal to said multiplexers, wherein said inhibit signal and said generated signal from said decoder means control operation of said multiplexers so that two columns of said redundant memory sub-array replace two defective columns of said memory sub-array irrespective of the location of said defective columns within said memory sub-array.

2. The P-way associative cache memory as recited in claim 1, wherein said system clock having a clock cycle provides timing to said memory sub-array and to said redundant memory sub-array, and wherein said redundant late select address signal is generated later in said clock cycle than signals indicative of a column address in said at least one memory sub-array.

3. The P-way associative cache memory as recited in claim 1, wherein columns in each of said memory sub-arrays are respectively coupled to said memory read busses in accordance to a predetermined bit weight criteria.

4. The P-way associative cache memory as recited in claim 1, wherein columns in each of said at least one redundant memory sub-array are selectively coupled to said memory read busses in accordance to a predetermined bit weight criteria.

5. The P-way associative cache memory as recited in claim 1, wherein said at least one logic circuit further comprises:

an AND-gate responsive to said address corresponding to said defective column and to said redundant late select signal as its control signals, for selectively outputting said inhibit signal.

6. The P-way associative cache memory as recited in claim 1, wherein said P-way associative cache memory is selected from a group consisting of a 4-way, 8-way, and 16-way associative cache memory.

* * * * *